(12) United States Patent
Sturgis

(10) Patent No.: US 10,433,468 B2
(45) Date of Patent: Oct. 1, 2019

(54) HIGHLY RFI SHIELDED MODULAR ELECTRONICS PACKAGING SYSTEM

(71) Applicant: Associated Universities, Inc., Washington, DC (US)

(72) Inventor: Silversun Sturgis, Socorro, NM (US)

(73) Assignee: Associated Universities, INC., Washington, DC (US)

( * ) Notice: Subject to any disclaimer, the term of this patent is extended or adjusted under 35 U.S.C. 154(b) by 0 days.

(21) Appl. No.: 16/042,013

(22) Filed: Jul. 23, 2018

(65) Prior Publication Data

US 2019/0045673 A1 Feb. 7, 2019

Related U.S. Application Data

(60) Provisional application No. 62/541,279, filed on Aug. 4, 2017.

(51) Int. Cl.
*H05K 9/00* (2006.01)
*G06F 1/18* (2006.01)

(52) U.S. Cl.
CPC .......... *H05K 9/0016* (2013.01); *G06F 1/182* (2013.01); *H05K 9/0024* (2013.01); *H05K 9/0037* (2013.01); *H05K 9/0041* (2013.01); *H05K 9/0062* (2013.01)

(58) Field of Classification Search
CPC .......... H01L 23/552; H01L 2924/3025; H05K 9/0032; H05K 9/0024; H05K 9/003; H05K 7/1487; H05K 7/1409; H05K 2201/10371; H05K 9/0016; H05K 9/0037; H05K 9/0062; H05K 9/0009; H05K 9/0015; H05K 9/0041; G06F 1/187; G06F 1/181; G06F 1/182
See application file for complete search history.

(56) References Cited

U.S. PATENT DOCUMENTS

| | | | | |
|---|---|---|---|---|
| 5,252,782 A * | 10/1993 | Cantrell | .............. | H05K 9/0033 174/387 |
| 5,825,634 A * | 10/1998 | Moorehead, Jr. | .... | H05K 9/0035 361/816 |
| 5,828,546 A * | 10/1998 | Tirrell | .................. | G11B 33/125 361/679.39 |
| 6,284,970 B1 * | 9/2001 | Buskmiller | .......... | H05K 7/1461 174/368 |

* cited by examiner

*Primary Examiner* — James Wu
(74) *Attorney, Agent, or Firm* — Remenick PLLC

(57) ABSTRACT

A modular system for containing electronic components has at least one storage bin and a plurality of Radio Frequency Interference (RFI) shielded electronics enclosures. Each RFI shielded electronics enclosure is at least one hollowed-out body; at least one hollowed-out cover, wherein the at least one hollowed-out cover is adapted to mate with the at least one hollowed-out body; and a plurality of fastening devices adapted to secure the at least one hollowed-out cover to the at least one hollowed-out body.

17 Claims, 5 Drawing Sheets

Exploded view of module

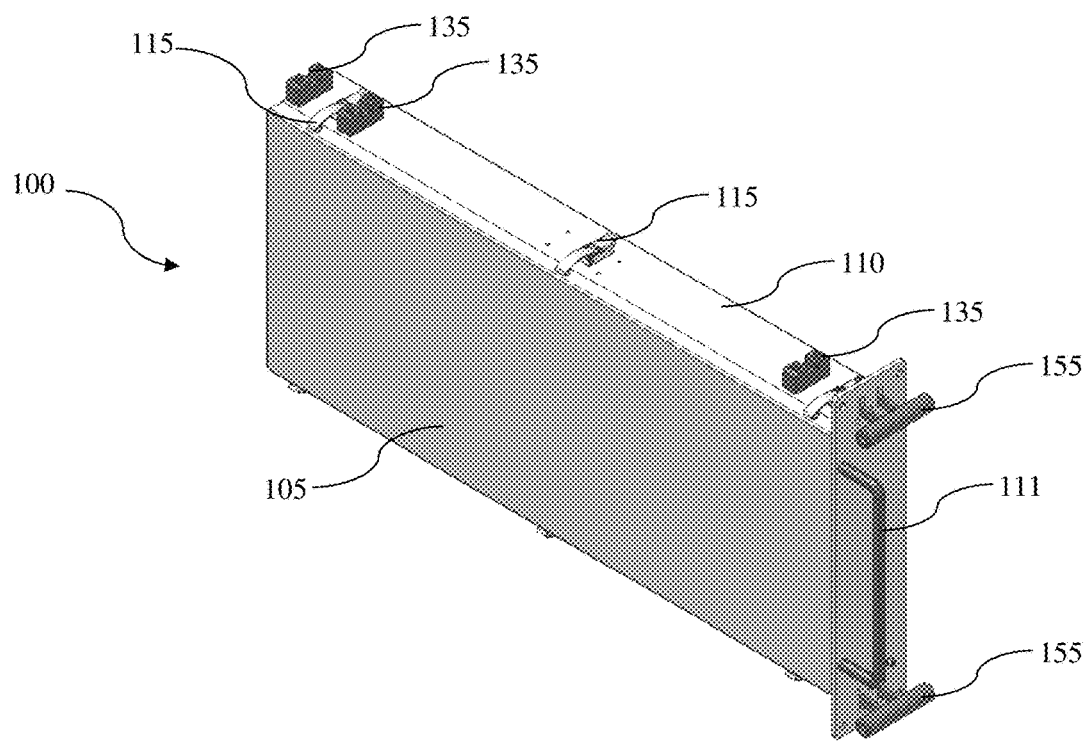
Figure 1. Standard module

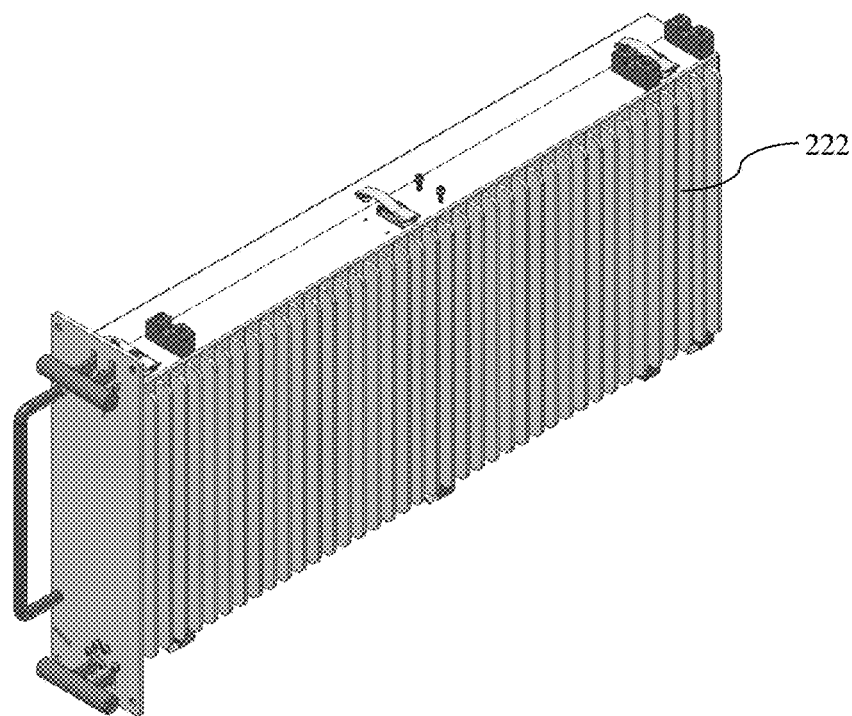
Figure 2. Module with integrated heatsink
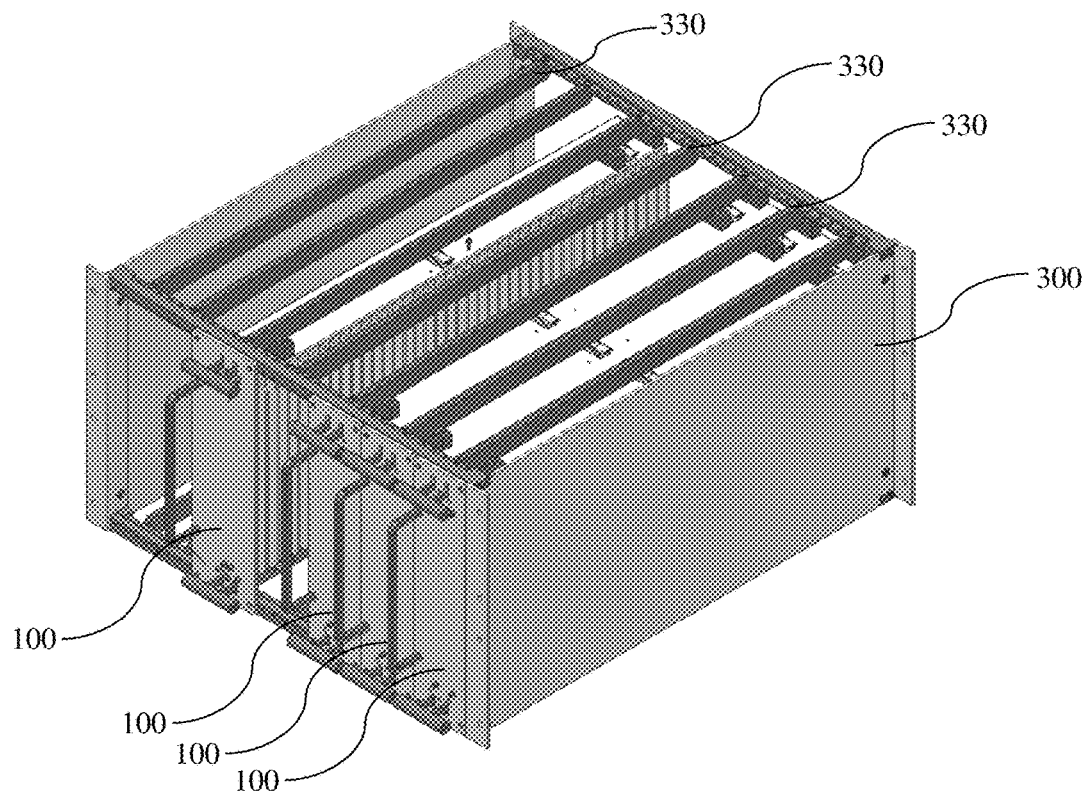
Figure 3. Modules in bin

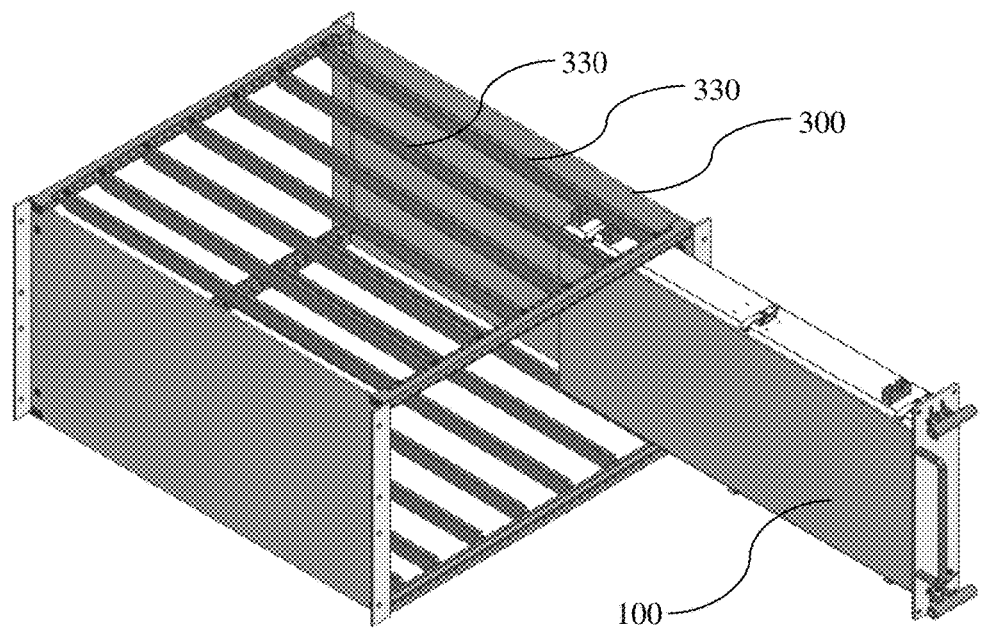
Figure 4. Module being installed in bin
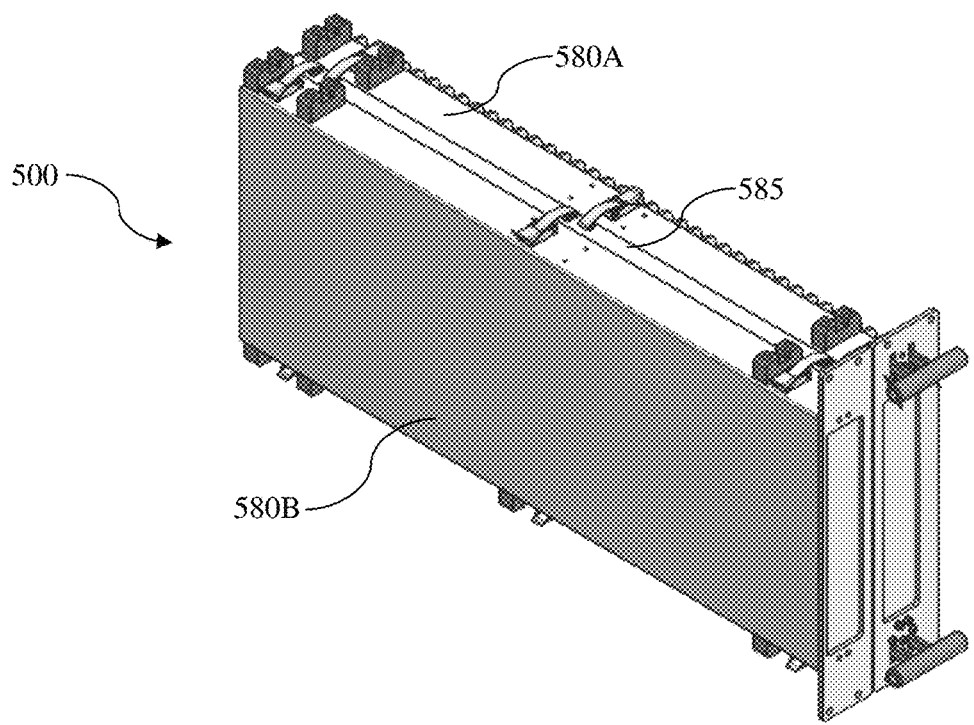
Figure 5. Multi cavity module (this embodiment shows two cavities)

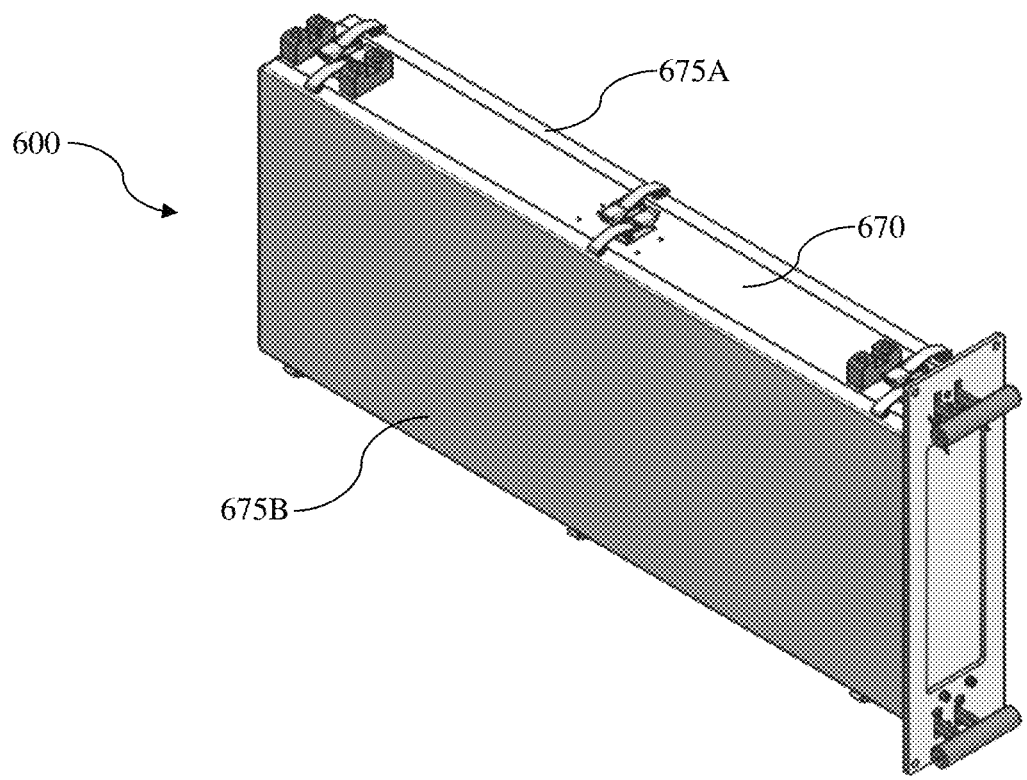
Figure 6. Double-sided module
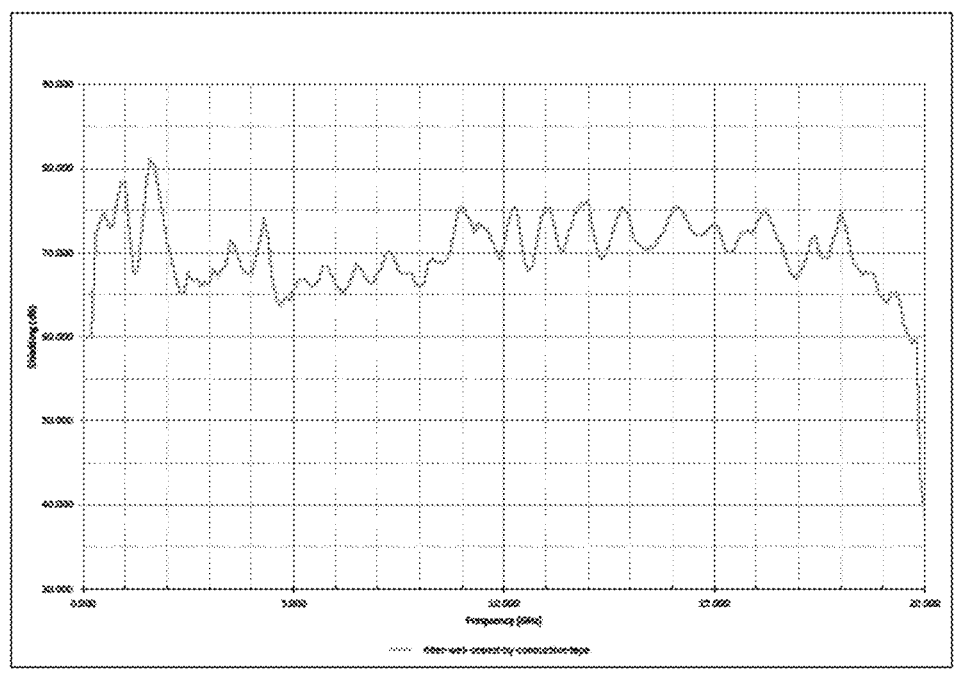
Figure 7. Preliminary shielding effectiveness test

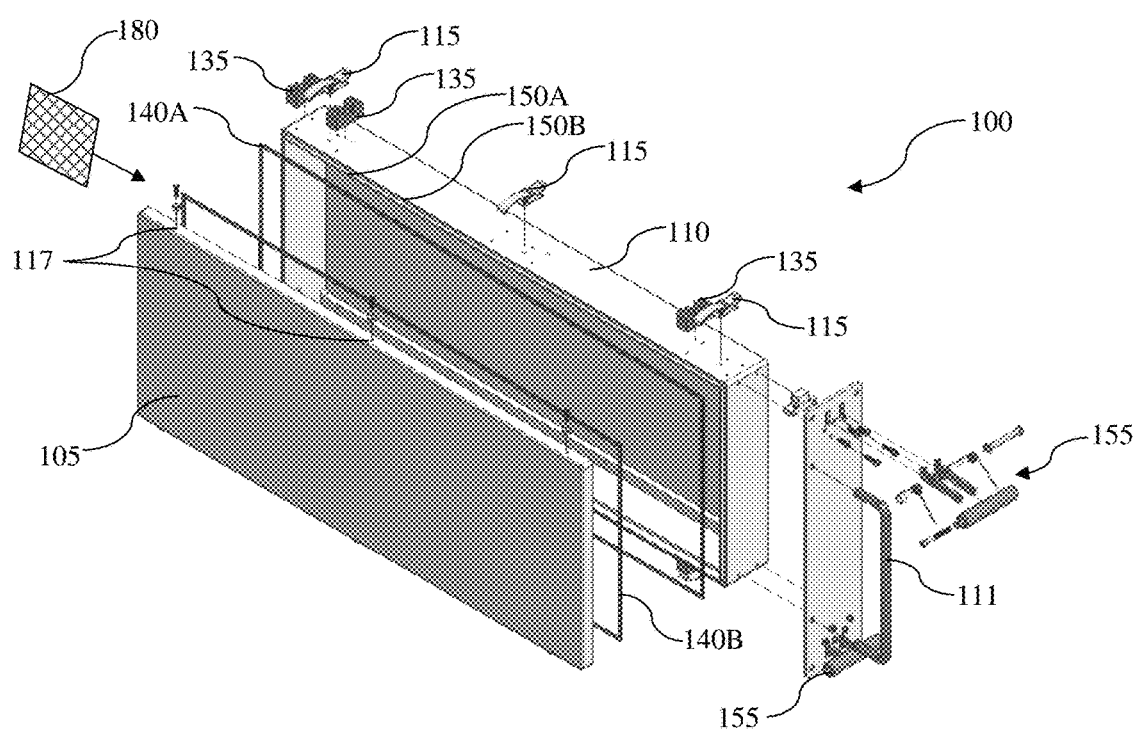
Figure 8. Exploded view of module

HIGHLY RFI SHIELDED MODULAR ELECTRONICS PACKAGING SYSTEM

REFERENCE TO RELATED APPLICATIONS

This application claims priority to U.S. Provisional Application No. 62/541,279, filed Aug. 4, 2017, entitled "Highly RFI Shielded Modular Electronics Packaging System," and hereby specifically and entirely incorporated by reference.

RIGHTS IN THE INVENTION

This invention was made with government support under Cooperative Agreement AST-1519126, between the National Science Foundation and Associated Universities, Inc., and, accordingly, the United States government has certain rights in this invention.

BACKGROUND

1. Field of the Invention

This invention is directed to electronics packaging systems. Specifically, the invention is also directed to Radio Frequency Interference (RFI) shielded modular electronics packaging systems.

2. Description of the Background

An electronics rack is typically a metal frame used to hold various hardware devices such as servers, hard disk drives, modems, testing equipment, sensor equipment, converters, and other electronic equipment. Racks often resemble a shelving structure where components can be attached vertically and stacked on top of one another.

Typically, the individual electronic devices are screwed into the front, which has tapped metal strips with spaced holes to accommodate the height of the devices. While racks come in many different shapes and sizes, the standard (traditional) size rack is 19-inches wide. Racks are usually made of aluminum or stainless steel. The Electronics Industries Association (EIA) establishes standards for cabinets and racks intended for use with computers and other electronic equipment.

In radio astronomy and other highly sensitive computing environments, it is necessary that any electronics emitting radio frequency interference not be allowed to interfere with the radio waves being observed or other electronic components. Often entities have to design and build their own RFI shielded electronics enclosures as there are no commercial products that meet the demanding requirements. These house-built enclosures are expensive, take considerable time and effort to open or close, have expensive cooling strategies, and the shielding levels are often inadequate.

Therefore, there exists a need for an off the shelf, customizable, and RFI shielded modular electronics enclosure.

SUMMARY

The present invention overcomes the problems and disadvantages associated with current strategies and designs and provides new systems for enclosing electronics in RFI shielded devices.

One embodiment of the invention is directed to an Radio Frequency Interference (RFI) shielded electronics enclosure. The enclosure comprises at least one hollowed-out body, at least one hollowed-out cover, wherein the at least one hollowed-out cover is adapted to mate with the at least one hollowed-out body, and a plurality of fastening devices adapted to secure the at least one hollowed-out cover to the at least one hollowed-out body.

In one embodiment, the enclosure preferably further comprises a plurality of gaskets positioned between the at least one hollowed-out cover and the at least one hollowed-out body. Preferably, each gasket is positioned at a different height. Preferably, the at least one hollowed-out cover and the at least one hollowed-out body are ridged components. In a preferred embodiment, the plurality of fastening devices are latches adapted to quickly release the at least one hollowed-out cover from the at least one hollowed-out body.

Preferably, the enclosure is adapted to be inserted into a bin for storage in an electronics rack. The enclosure preferably further comprises guide blocks adapted to guide the enclosure into the bin. The enclosure preferably further comprises a securement device adapted to secure the enclosure into the bin. Preferably, the securement device is one of a spring-loaded latch mechanism or a plurality of screws. The enclosure preferably further comprises at least one of a heatsink and an air flow filters.

Another embodiment of the invention is directed to a modular system for containing electronic components. The system comprises at least one storage bin, and a plurality of Radio Frequency Interference (RFI) shielded electronics enclosures. Each RFI shielded electronics enclosure comprises at least one hollowed-out body, at least one hollowed-out cover, wherein the at least one hollowed-out cover is adapted to mate with the at least one hollowed-out body, and a plurality of fastening devices adapted to secure the at least one hollowed-out cover to the at least one hollowed-out body.

In a preferred embodiment, the RFI shielded electronics enclosures further comprise a plurality of gaskets positioned between the at least one hollowed-out cover and the at least one hollowed-out body. Preferably, each gasket is positioned at a different height. Preferably, the at least one hollowed-out cover and the at least one hollowed-out body are ridged components. The plurality of fastening devices are preferably latches adapted to quickly release the at least one hollowed-out cover from the at least one hollowed-out body.

Preferably, the bin is adapted for storage in an electronics rack. In a preferred embodiment, the RFI shielded electronics enclosures further comprise guide blocks and the bin further comprises guide rails, wherein the guide blocks are adapted to made with the guide rails to guide the RFI shielded electronics enclosures into the bin. Preferably, the RFI shielded electronics enclosures further comprise a securement device adapted to secure the enclosure into the bin. Preferably, the securement device is one of a spring-loaded latch mechanism or a plurality of screws. In a preferred embodiment, the RFI shielded electronics enclosures further comprise at least one of a heatsink and an air flow filters. Preferably, at least one hollowed-out cover and the at least one hollowed-out body are arrangeable in different configurations to produce at least one of different sized RFI shielded electronics enclosures and multiple chambered RFI shielded electronics enclosures.

Other embodiments and advantages of the invention are set forth in part in the description, which follows, and in part, may be obvious from this description, or may be learned from the practice of the invention.

DESCRIPTION OF THE FIGURES

FIG. 1 depicts an embodiment of a module.
FIG. 2 depicts an embodiment of a module with a heat sink.
FIG. 3 depicts an embodiment of a modules in a bin.
FIG. 4 depicts an embodiment of a module being inserted into a bin.
FIG. 5 depicts an embodiment of a multi cavity module.
FIG. 6 depicts an embodiment of a double-sided module.
FIG. 7 depicts results from a shielding effectiveness test.
FIG. 8 depicts and exploded view of the embodiment of the module of FIG. 1.

DESCRIPTION OF THE INVENTION

As embodied and broadly described herein, the disclosures herein provide detailed embodiments of the invention. However, the disclosed embodiments are merely exemplary of the invention that may be embodied in various and alternative forms. Therefore, there is no intent that specific structural and functional details should be limiting, but rather the intention is that they provide a basis for the claims and as a representative basis for teaching one skilled in the art to variously employ the present invention.

A rack mounted RFI shielded electronics enclosure system that has high levels of shielding even at high frequencies and is also fast and convenient to open and close without being too expensive to manufacture was surprisingly developed. Additionally, the enclosure design preferably allows for a variety of packaging options and heat transfer options as desired. While the device is described with reference to RFI shielding, it may be capable of electromagnetic interference (EMI) shielding, environmental shielding, or other types of shielding. For example, the device may be gas or air tight, water tight, and/or dust proof.

FIG. 1 depicts an embodiment of a modular electronics packaging module 100. Module 100 is preferably a box that can be mounted into a bin 300 that holds a series of modules, which in turn can be install in a standard electronics rack (see FIG. 3). The modules are preferably RFI shielded aluminum boxes with shielding levels of approximately 70 db from 1-19 GHz (see FIG. 7). However, depending on the material used for the modules, the gaskets, and other components, the modules 100 may provide greater or less shielding. For example, module 100 can be made of plastic, nylon, other metals, wood, or other man made or naturally occurring materials. While module 100 is shown as rectangular, module 100 can have another shape as necessary to fit the desired electronics, bin, and/or rack.

Typically, in order to achieve the required RFI shielding levels, an enclosure must have proper RFI gaskets and have a large number of properly torqued screws spaced very close together to close the enclosure without allowing for RFI leakage. For example, existing RFI shielded enclosures may have 80 or more screws spaced millimeters apart. The large number of screws can make opening and closing the enclosure very time consuming and significantly increases maintenance costs and down time.

Shielded modules 100 are preferably comprised of cover 105 and body 110. Cover 105 and body 110 are preferably stiff components that allow little to no warping or other deformation during assembly. Thereby minimizing the seam between the two components and preventing RFI leakage. Cover 105 and body 110 are preferably held securely together via compression latches 115, which preferably take only seconds to open or close compared to the hours necessary for similarly sized screwed together enclosures. Preferably, latches 115 are positioned both on the top and bottom of module 100. In other embodiments, latches 115 may be position on just one side of module 100, on the front or rear sides of module 100 and/or on all sides of module 100. Other fastening devices can be used instead of latches 115. For example, screws, bolts, adhesive, hook and loop strips, clamps, elastic, etc. Preferably, cover 105 and/or body 110 has a plurality of latch keepers 117, recesses, or other devices to accept latches 115. Furthermore, the shielding levels achieved are significantly higher than previous module designs and the cost is comparable to the least expensive existing modules. Cover 105 and/or body 110 may have one or more mounting fixtures within the components to install electronic devices.

There are many possible configurations for module 100, but the primary configuration is preferably sized for a standard 19-inch electronics rack and is 6 Rack Units (RU) tall (10.5 inches) by 20 inches deep (see FIGS. 3 and 4). FIG. 3 depicts several modules 100 within a bin 300 that can be stored in a standard electronics rack. FIG. 4 depicts a single module 100 being inserted into a bin 300. In this configuration, module 100 has 34 horizontal positions spaced at ½ inch intervals. Front to rear rails 330 on the bin preferably mate to guide blocks 135 on the module 100 allowing easy insertion and removal of the modules 100 from the bin 300. In some embodiment, other guides and mounting components may be used to properly seat modules 100 into bin 300. Module sizes are preferably 20 inches deep by 10.5 inches tall (external dimensions) and widths may start at 1 inch and, for example, may increase in size by ½ inch, with a standard module at 2.5 inches wide. The modules 100 may also have non-standard sizes to fit custom or non-standard bins and racks. Narrower modules 100 may utilize screws in place of latches. Module 100 may also include a handle 111 for assisting in inserting and removing module 100 from bin 300.

The bin 300 can be configured for any rack height, width, or depth (for example height may increase in standard 1.75-inch increments). Similarly, the modules 100 can be configured for any bin size. A bin of any depth can be configured to fit any rack vertical rail spacing.

A standard module 100 preferably consists of body 110 and cover 115, which are preferably high tolerance machined pieces of aluminum that fit together like a clamshell leaving a cavity in the middle for electronics (see FIG. 8 for an exploded view of module 100). Modules 100 preferably have double gasket seams around the edge utilizing RFI gaskets 140A and 140B and a series of compression latches 115 that compress the gaskets 140A and 140B to ensure a high level of RFI shielding is achieved. The double gaskets may be positioned at different heights within body 110 and 115 so that the RFI signals do not have a straight path out of module 100. Preferably, gasket 140A sits on inner lip 150A of body 100 and gasket 140B sits on outer lip 150B of body 100. Gaskets 140A and B preferably provide RFI shielding, EMI shielding, environmental shielding, and/or other types of shielding. For example, the gaskets may make module 100 gas or air tight, water tight, and/or dust proof.

Preferably, a front panel 150 is attached to body 110 (however, front panel 150 can be attached to cover 115). Front panel 150 preferably has two methods of holding the module 100 in the bin 300. Front panel 150 may either have four thumbscrews or other fastening device to couple module 100 to bin 300 or a spring-loaded latch mechanism 155 that allows module 100 to be slid into bin 300 and automatically locks module 100 into place.

Other possible configurations include a three-piece module of which there are two types: A double-sided module 600 which has a thick central, hollow piece 670 with two thinner side covers 675A and 675B, all of which can vary in width (see FIG. 6); and a multi cavity module 500 which is two thicker side bodies 580A and 580B with a solid, thinner central piece 585 all of which can vary in width (see FIG. 5), thereby creating two enclosures separated by central piece 585. The benefits of these two configurations are that the double-sided module 600 preferably allows for both sides of the electronics to be easily accessed, and the multi cavity module 500 preferably allows for two (or more) separately shielded cavities to exist in one module. Additionally, the side covers 675A and 675B on the double-sided module 600 are preferably the same as the cover 105 of the standard module 100 and the side bodies 580A and 580B on the double cavity module 500 are preferably the same as the main body piece 110 of the standard module 100. In each embodiment, additional gaskets and latches are added to secure the components together and RFI shield the modules.

In the embodiment shown in FIG. 2, the cover and or body can be customized with an integrated heatsink 222 or for custom component mounting. Honeycomb air flow filters 180 (see FIG. 8) can also be added to allow for air to flow through the module if necessary. Another benefit of this system is that there is no designated front, rear, top or bottom of the module. Modules may be inserted into the bin from either the front or the rear and either right side up or upside down. Input/output connections can be made on either the front or rear of the module and on either the cover 105 and/or the body 110. Preferably, in order to maintain the RFI shielding, a shielded connector should be used, however if RFI shielding is not required, any connector can be used. Blind mate connections are also possible with the addition of a panel on the rear of the bin to hold one side of the blind mate connector.

Other embodiments and uses of the invention will be apparent to those skilled in the art from consideration of the specification and practice of the invention disclosed herein. All references cited herein, including all publications, U.S. and foreign patents and patent applications, are specifically and entirely incorporated by reference. The term comprising, where ever used, is intended to include the terms consisting and consisting essentially of. Furthermore, the terms comprising, including, and containing are not intended to be limiting. It is intended that the specification and examples be considered exemplary only with the true scope and spirit of the invention indicated by the following claims.

The invention claimed is:

1. A Radio Frequency Interference (RFI) shielded electronics enclosure, comprising:
    at least one hollowed-out body having an inner lip and an outer lip, wherein the inner lip extends further than the outer lip;
    at least one hollowed-out cover, wherein the at least one hollowed-out cover is adapted to cover the inner lip and abut the outer lip of the at least one hollowed-out body to prevent RFI leakage;
    a plurality of fastening devices adapted to secure the at least one hollowed-out cover to the at least one hollowed-out body; and
    a plurality of gaskets positioned between the at least one hollowed-out cover and the at least one hollowed-out body, wherein a first gasket of the plurality of gaskets is positioned adjacent to the inner lip and a second gasket of the plurality of gaskets is positioned adjacent to the outer lip of each of the at least one hollowed-out body.

2. The RFI shielded electronics enclosure of claim 1, wherein the at least one hollowed-out cover and the at least one hollowed-out body are rigid components.

3. The RFI shielded electronics enclosure of claim 1, wherein the plurality of fastening devices are latches adapted to quickly release the at least one hollowed-out cover from the at least one hollowed-out body.

4. The RFI shielded electronics enclosure of claim 1, wherein the enclosure is adapted to be inserted into a bin for storage in an electronics rack.

5. The RFI shielded electronics enclosure of claim 4, further comprising guide blocks adapted to guide the enclosure into the bin.

6. The RFI shielded electronics enclosure of claim 4, further comprising a securement device adapted to secure the enclosure into the bin.

7. The RFI shielded electronics enclosure of claim 6, wherein the securement device is one of a spring-loaded latch mechanism or a plurality of screws.

8. The RFI shielded electronics enclosure of claim 1, further comprising at least one of a heatsink and an air flow filter.

9. A modular system for containing electronic components, comprising
    at least one storage bin;
    and a plurality of Radio Frequency Interference (RFI) shielded electronics enclosures, each RFI shielded electronics enclosure comprising:
        at least one hollowed-out body having an inner lip and an outer lip, wherein the inner lip extends further than the outer lip;
        at least one hollowed-out cover, wherein the at least one hollowed-out cover is adapted to cover the inner lip and abut the outer lip of the at least one hollowed-out body to prevent RFI leakage;
        a plurality of fastening devices adapted to secure the at least one hollowed-out cover to the at least one hollowed-out body; and
        a plurality of gaskets positioned between the at least one hollowed-out cover and the at least one hollowed-out body, wherein a first gasket of the plurality of gaskets is positioned adjacent to the inner lip and a second gasket of the plurality of gaskets is positioned adjacent to the outer lip of each of the at least one hollowed-out body.

10. The modular system of claim 9, wherein the at least one hollowed-out cover and the at least one hollowed-out body are rigid components.

11. The modular system of claim 9, wherein the plurality of fastening devices are latches adapted to quickly release the at least one hollowed-out cover from the at least one hollowed-out body.

12. The modular system of claim 9, wherein the bin is adapted for storage in an electronics rack.

13. The modular system of claim 9, wherein the RFI shielded electronics enclosures further comprise guide blocks and the bin further comprises guide rails, wherein the guide blocks are adapted to made with the guide rails to guide the RFI shielded electronics enclosures into the bin.

14. The modular system of claim 9, wherein the RFI shielded electronics enclosures further comprise a securement device adapted to secure the enclosure into the bin.

15. The modular system of claim 14, wherein the securement device is one of a spring-loaded latch mechanism or a plurality of screws.

16. The modular system of claim 11, wherein the RFI shielded electronics enclosures further comprise at least one of a heatsink and an air flow filter.

17. The modular system of claim 9, wherein the at least one hollowed-out cover and the at least one hollowed-out body are arrangeable in different configurations to produce at least one of different sized RFI shielded electronics enclosures and multiple chambered RFI shielded electronics enclosures.

\* \* \* \* \*